(12) United States Patent
Shin et al.

(10) Patent No.: US 10,254,578 B2
(45) Date of Patent: Apr. 9, 2019

(54) LIQUID CRYSTAL DISPLAY DEVICE AND METHOD OF MANUFACTURING THE SAME

(71) Applicant: SAMSUNG DISPLAY CO., LTD., Yongin, Gyeonggi-do (KR)

(72) Inventors: Dong Hee Shin, Asan-si (KR); Dong Hyeon Ki, Asan-si (KR); Bo Yeong Kim, Asan-si (KR); Byoung Sun Na, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 106 days.

(21) Appl. No.: 15/146,140

(22) Filed: May 4, 2016

(65) Prior Publication Data

US 2017/0102578 A1    Apr. 13, 2017

(30) Foreign Application Priority Data

Oct. 8, 2015   (KR) .................. 10-2015-0141684

(51) Int. Cl.
| | |
|---|---|
| *G02F 1/1339* | (2006.01) |
| *G02F 1/1362* | (2006.01) |
| *G02F 1/1335* | (2006.01) |
| *G02F 1/1337* | (2006.01) |
| *H01L 27/12* | (2006.01) |
| *H01L 29/786* | (2006.01) |

(52) U.S. Cl.
CPC ...... *G02F 1/133512* (2013.01); *G02F 1/1339* (2013.01); *G02F 1/13394* (2013.01); *G02F 1/133514* (2013.01); *G02F 1/133711* (2013.01); *G02F 1/136209* (2013.01); *H01L 27/124* (2013.01); *H01L 27/1222* (2013.01); *H01L 27/1262* (2013.01); *H01L 29/78633* (2013.01); *H01L 29/78669* (2013.01); *G02F 2001/136222* (2013.01)

(58) Field of Classification Search
CPC ......... G02F 1/133512; G02F 1/136209; G02F 1/1339; G02F 1/13392; G02F 2001/136222
See application file for complete search history.

(56) References Cited

U.S. PATENT DOCUMENTS

| | | | |
|---|---|---|---|
| 2011/0090445 A1* | 4/2011 | Kim ..................... | G02F 1/1339 349/139 |
| 2014/0009447 A1 | 1/2014 | Kim | |

\* cited by examiner

*Primary Examiner* — Angela K Davison
(74) *Attorney, Agent, or Firm* — Cantor Colburn LLP

(57) ABSTRACT

A liquid crystal display device includes: a first substrate; a second substrate disposed opposite to the first substrate, where a display area and a non-display area are defined in each of the first and second substrates; a liquid crystal layer disposed between the first substrate and the second substrate; a common voltage line disposed in the non-display area of the first substrate; a light-shielding pattern disposed on the common voltage line and including an open portion, which at least partially exposes the common voltage line; and a dummy color layer disposed below the common voltage line and at least partially overlapping the open portion. The light-shielding pattern includes a first stepped portion disposed on a side of the open portion and a second stepped portion disposed on another side of the open portion, and the dummy color layer overlaps at least one of the first and second stepped portions.

8 Claims, 13 Drawing Sheets

LIQUID CRYSTAL DISPLAY DEVICE AND METHOD OF MANUFACTURING THE SAME

This application claims priority to Korean Patent Application No. 10-2015-0141684, filed on Oct. 8, 2015, and all the benefits accruing therefrom under 35 U.S.C. § 119, the content of which in its entirety is herein incorporated by reference.

BACKGROUND

1. Field

Exemplary embodiments of the invention relate to a liquid crystal display ("LCD") device and a method of manufacturing the LCD device.

2. Description of the Related Art

In general, a liquid crystal display ("LCD") device includes an array substrate, a counter substrate facing the array substrate, and a liquid crystal layer interposed between the array substrate and the counter substrate, and is divided into a display area, in which a plurality of pixels are arranged to display an image, and a non-display area, which is provided in the periphery of the display area and in which driving circuits or the like are arranged.

Recently, a high-transmittance LCD device employing a color filter-on-array ("COA") substrate, which is an array substrate with color filters formed thereon, has been developed. In such a type of LCD device, misalignment may occur between the COA substrate and a counter substrate, on which a light-shielding member is provided, in the process of coupling the COA substrate and the counter substrate to each other. To prevent such a misalignment, a black matrix-on-array ("BOA") substrate, which is a COA substrate with a light-shielding member formed thereon, has been developed, and black column spacers ("BCS"s), which may be formed of the same material and at the same time as column spacers for maintaining the gap between a light-shielding pattern and a substrate, also have been developed.

In an LCD device employing the BOA and the BCSs, a common voltage may be applied to a common electrode on a counter substrate via conductive balls included in a sealing member, and openings may be formed on a light-shielding pattern. However, even though the openings are provided, the conductive balls and the common electrode may not be properly placed in contact with each other due to the thickness of the light-shielding pattern. In order for the conductive balls and the common electrode to properly contact each other, a dummy color layer may be provided below the openings so as to form a height difference.

SUMMARY

In a liquid crystal display ("LCD") device employing the black matrix-on-array ("BOA") substrate and the black column spacers ("BCS"s), in the case of a large-size panel, a light-shielding pattern and a dummy color layer may be formed by a stitch-shot method. In this case, the open portion of the light-shielding pattern and the dummy color layer may be misaligned with each other because a "stitch shot" for forming the light-shielding pattern differs from a "stitch shot" for forming the dummy color layer. Thus, a metal may be exposed from the bottom of the open portion, in which case, reflected light from the metal may be visible, or a stack of the dummy color layer and the light-shielding pattern may form a protrusion, in which case, a smudge may be visible.

Exemplary embodiments of the invention provide a liquid crystal display device in which such reflected light and smudge are effectively prevented from being visible. The liquid crystal display device may include a plurality of stepped portions on the light-shielding pattern.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, a liquid crystal display ("LCD") device includes: a first substrate; a second substrate disposed opposite to the first substrate, where a display area and a non-display area are defined in each of the first and second substrates; a liquid crystal layer disposed between the first and second substrates; a common voltage line disposed in the non-display area of the first substrate; a light-shielding pattern disposed on the common voltage line and including an open portion, which at least partially exposes the common voltage line; and a dummy color layer disposed below the common voltage line and at least partially overlapping the open portion when viewed from a top plan view. In such an embodiment, the light-shielding pattern includes a first stepped portion, which is disposed on a side of the open portion, and a second stepped portion, which is disposed on another side of the open portion, and the dummy color layer overlaps at least one of the first and second stepped portions when viewed from the top plan view.

According to the exemplary embodiments, an LCD device includes: a first substrate; a second substrate disposed opposite to the first substrate, where a display area and a non-display area are defined in each of the first and second substrates; a liquid crystal layer disposed between the first and second substrates; first, second and third common voltage lines disposed in the non-display area of the first substrate; a light-shielding pattern disposed on the first, second and third common voltages lines and including first, second and third open portions, which at least partially expose the first, second and third common voltage lines, respectively; and first and second dummy color layers disposed below the first and third common voltage lines, respectively, and at least partially overlapped by the first and third open portions, respectively when viewed from a top plan view. In such an embodiment, the first, second and third open portions are sequentially arranged in a first direction, the light-shielding pattern includes "1-1", "2-1" and "3-1" stepped portions, which are disposed on a side of the first, second and third open portions, respectively, and "1-2", "2-2" and "3-2" stepped portions, which are disposed on another side of the first, second and third open portions, respectively, the first dummy color layer overlaps by one of the "1-1" and "1-2" stepped portions when viewed from the top plan view, and the third dummy color layer overlaps one of the "3-1" and "3-2" stepped portions when viewed from the top plan view.

According to the exemplary embodiments, a method of manufacturing the LCD device includes: providing a dummy color layer on a non-display area of a first substrate, which includes a display area and the non-display area; providing a common voltage line on the dummy color layer; and providing a light-shielding pattern including an open portion, which at least partially exposes the common voltage line on the common voltage line. In such an embodiment, the light-shielding pattern includes a first stepped portion, which is disposed on a side of the open portion, and a second stepped portion, which is disposed on another side of the open portion, and the dummy color layer overlaps at least one of the first and second stepped portions when viewed from a top plan view.

Other features and exemplary embodiments will be apparent from the following detailed description, the drawings, and the claims.

BRIEF DESCRIPTION OF THE DRAWINGS

The above and other aspects and features of the invention will become more apparent by describing in detail exemplary embodiments thereof with reference to the attached drawings, in which.

DETAILED DESCRIPTION

Figure 1:
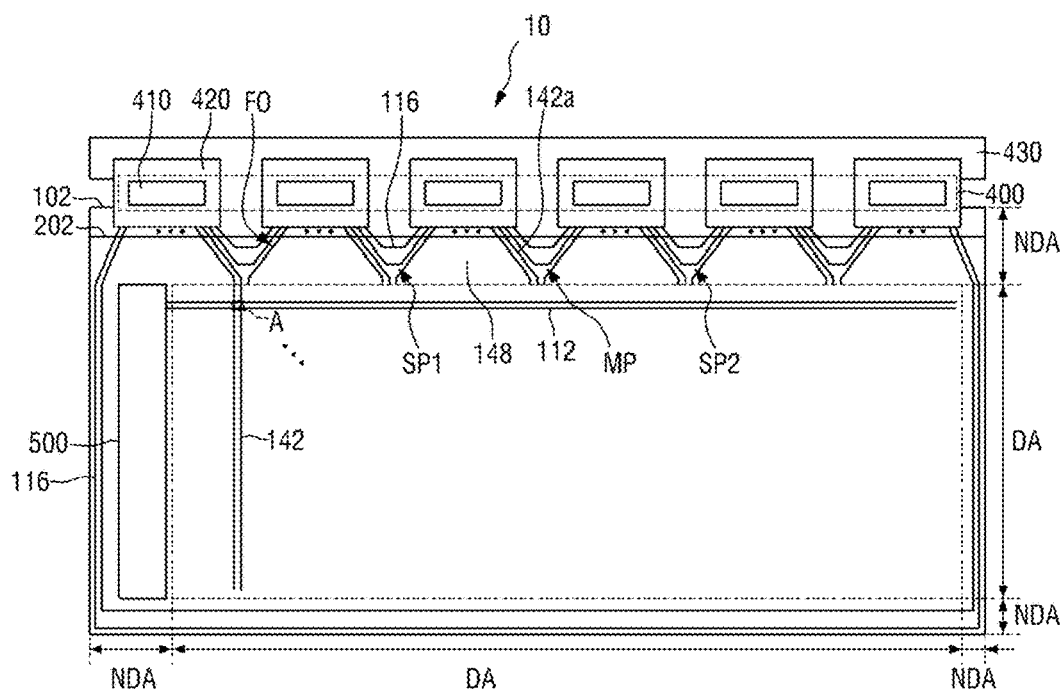
FIG. 1 is a schematic plan view of a liquid crystal display ("LCD") device according to an exemplary embodiment of the invention.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The same or similar parts throughout the specification are denoted by the same reference numerals.

Hereinafter, exemplary embodiments of the invention will be described in detail referring to the accompanying drawings.

Figure 2:
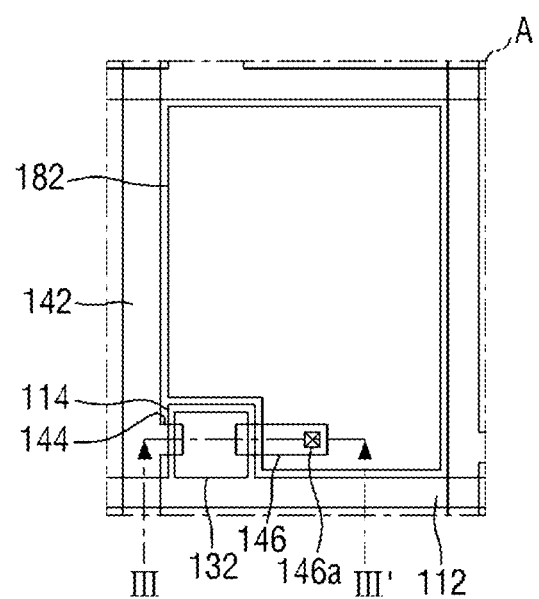
FIG. 2 is an enlarged view of an area A of FIG. 1.
Figure 3:
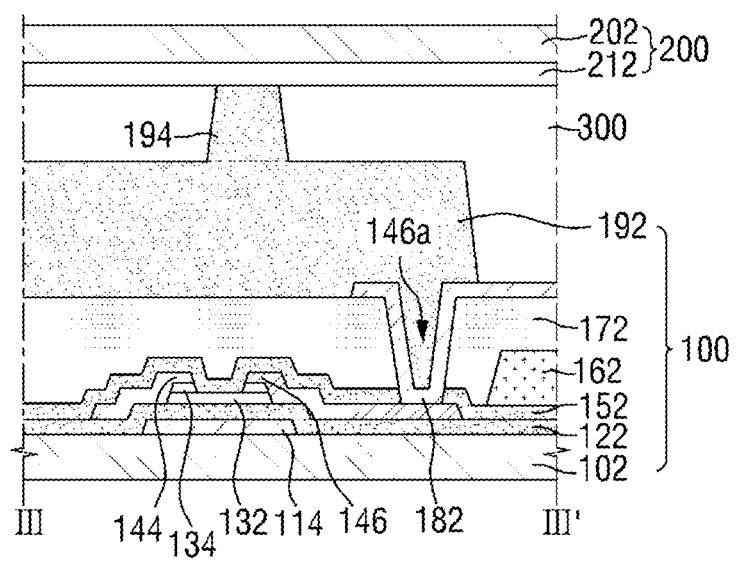
FIG. 3 is a cross-sectional view taken along line III-III' of FIG. 2.

FIG. 1 is a schematic plan view of a liquid crystal display ("LCD") device according to an exemplary embodiment of the invention. FIG. 2 is an enlarged view of an area A of FIG. 1. FIG. 3 is a cross-sectional view taken along line III-III' of FIG. 2.

Referring to FIGS. 1 to 3, an exemplary embodiment of an LCD device 10 includes a first display substrate 100, a second display substrate 200, which faces the first display substrate 100, and a liquid crystal layer 300, which is interposed between the first and second display substrates 100 and 200.

The LCD 10 includes a display area DA and a non-display area NDA. In such an embodiment, a plurality of pixels, which are arranged in a matrix form, may be disposed in the display area.

In the display area DA of the first display substrate 100, a pixel electrode 182 may be provided for each of the pixels. The pixel electrode 182 may receive a data voltage via a thin-film transistor ("TFT"). A common electrode 212 may have a plate-like shape and be disposed to cover the entire display area DA of the second display substrate 200. The pixel electrode 182 may form an electric field together with the common electrode 212 and may thus control the alignment direction of liquid crystal molecules in the liquid crystal layer 300 disposed between the pixel electrode 182 and the common electrode 212.

A data driver 400, which provides a data driving signal, and a gate driver 500, which provides a gate driving signal, may be disposed outside the display area DA of the first display substrate 100.

The data driver 400 may receive image signals and a data control signal from a timing controller (not illustrated). The data driver 400 may generate analog data voltages corresponding to the image signals in response to the data control signal. The data driver 400 may provide the data voltages to the pixels via data transmission lines 142a and data lines 142. The data transmission lines 142a and the data lines 142 may be electrically connected to each other.

The data driver 400 may include a plurality of data driving chips 410. The data driving chips 410 may be respectively disposed or mounted on first flexible printed circuit boards ("FPCB"s) 420, and may be connected to a driving circuit board 430 and data pads (not illustrated) in the non-display area NDA. Although not specifically illustrated, the first FPCBs 420, on which the data driving chips 410 are respectively mounted, may be connected to the data pads via anisotropic conductive films.

The gate driver 500 may generate gate signals in response to a gate control signal provided thereto from the timing controller, which is mounted on the driving circuit board 430. The gate signals may be sequentially provided to the pixels via gate lines 112 in units of rows. The gate driver 500 may be provided as an amorphous silicon gate ("ASG")-type gate driver integrally formed in the non-display area NDA, but the invention is not limited thereto. That is, alternatively, the gate driver 500 may be provided as a tape carrier package ("TCP")-type gate driver or a chip-on-glass ("COG")-type gate driver.

The first and second display substrates 100 and 200 may be coupled to each other, e.g., bonded together, via a sealing member including a sealant, for example. The sealing member may be disposed in the periphery of the first and second display substrates 100 and 200, and particularly, in the non-display area NDA.

In some exemplary embodiments, the display area DA may be rectangular when viewed in a top plan view or a plan view in a thickness direction of the LCD device 10, and the non-display area NDA may be in the shape of a rectangular frame along the boundaries of the display area DA. In such embodiments, the sealing member may also be disposed in, but not being limited to, the shape of a rectangular frame. In such an embodiment, the sealing member may in at least one of various shapes depending on the structure of the LCD device 10.

In some exemplary embodiments, the sealing member may include conductive members. In one exemplary embodiment, for example, the sealing member may include conductive balls, but the invention is not limited thereto. Alternatively, the sealing member may include conductive members of various cross-sectional shapes such as an oval or polygonal cross-sectional shape, other than the conductive balls.

The LCD device 10 may include fan-out portions FO, which are disposed in the non-display area NDA. The fan-out portions FO may be areas in which the data transmission lines 142a extending from the data driver 400 are disposed.

Referring to FIG. 1, the LCD device 10 may further include a first short portion SP1, a middle portion MP, and a second short portion SP2, which are disposed between the fan-out portions FO. The first short portion SP1, the middle portion MP and the second short portion SP2 may be sequentially arranged along a first direction (for example, a horizontal direction). In some exemplary embodiments, a common voltage may be applied to the common electrode 212 via the first and second short portions SP1 and SP2.

The structures of the first short portion SP1, the middle portion MP, and the second short portion SP2 will be described later in detail.

The liquid crystal layer 300, which includes liquid crystal molecules with positive dielectric anisotropy or negative dielectric anisotropy, may be interposed between the first and second display substrates 100 and 200.

The structures of the first and second display substrates 100 and 200 of the LCD device 10 will hereinafter be described.

In an exemplary embodiment, as shown in FIG. 3, the first display substrate 100 includes a first substrate 102 as a base substrate. The first substrate 102 may be an insulating substrate. In such an embodiment, the first substrate 102 may include an insulating material such as transparent glass, quartz, ceramic, silicon or transparent plastic. The material of the first substrate 102 may be appropriately selected. In some exemplary embodiments, the first substrate 102 may be flexible. In such embodiments, the first substrate 102 may be deformable through rolling, folding, or bending. In such embodiments, the first substrate 102 may have a Young's modulus (i.e., a tensile modulus) of about 0.01 to 300 gigaPascals (GPa), e.g., about 0.001 to about 1 GPa, or about 0.05 to about 0.5 GPa.

Gate wiring (112 and 114) and data wiring (142, 144, and 146) may be disposed on the first substrate 102.

The gate wiring (112 and 114) may include the gate lines 112 and a plurality of gate electrodes 114. The data wiring (142, 144, and 146) may include the data lines 142, a plurality of source electrodes 144, and a plurality of drain electrodes 146.

The gate wiring (112 and 114) and the data wiring (142, 144, and 146) may include or be formed of an aluminum (Al)-based metal such as Al or an Al alloy, a silver (Ag)-based metal such as Ag or an Ag alloy, a copper (Cu)-based metal such as Cu or a Cu alloy, a molybdenum (Mo)-based metal such as Mo or a Mo alloy, chromium (Cr), titanium (Ti) or tantalum (Ta). The gate wiring (112 and 114) and the data wiring (142, 144, and 146) may have a multilayer structure including two conductive films having different physical properties from each other. In one exemplary embodiment, for example, one of the two conductive films may include or be formed of an Al-based metal, an Ag-based metal, or a Cu-based metal and the other conductive film may be formed of a Mo-based metal, Cr, Ti, or Ta. In one exemplary embodiment, for example, the two conductive films include a Cr lower film and an Al upper film and an Al lower film and a Mo upper film. However, the invention is not limited there, and the gate wiring (112 and 114) and the data wiring (142, 144, and 146) may be formed of various metals and conductors other than those set forth herein.

The gate lines 112 may extend in the first direction along, for example, horizontally along the horizontal sides of each of the pixels, and the data lines 142 may extend in a second direction along, for example, vertically along the vertical sides of each of the pixels. In an exemplary embodiment, the gate lines 112 and the data lines 142 may intersect each other, thereby defining a plurality of pixel regions. In such an embodiment, the pixel regions may be defined by being surrounded by the gate lines 1112 and the data lines 142, but not being limited thereto.

A gate electrode 114 is connected to each of the gate lines 112 for each of the pixels. The gate electrode 114 may be branched off from a corresponding gate line 112 toward a semiconductor layer 132 or may be defined by as an extension of the corresponding gate line 112, but the invention is not limited thereto. Alternatively, the gate electrode 114 may be defined in an area of overlap between the corresponding gate line 112 and the semiconductor layer 132 on a path of the extension of the corresponding gate line 112.

A source electrode 144 is connected to each of the data lines 142. The source electrode 144 may be branched off from a corresponding data line 142 toward the semiconductor layer 132 or may be formed as an extension of the corresponding data line 142, but the invention is not limited thereto. Alternatively, the source electrode 144 may be defined in an area of overlap between the corresponding data line 142 and the semiconductor layer 132 on a path of the extension of the corresponding data line 142. In one exemplary embodiment, for example, the source electrode 114 may be disposed in a same layer or on substantially the same plane as the corresponding data line 142 without protruding beyond the corresponding data line 142. A drain electrode 146 may be spaced from the source electrode 114 relative to the semiconductor layer 132, and may be electrically connected to the pixel electrode 182 via a contact hole 146a, which is defined in a passivation layer 152 and an organic layer 172.

A gate insulating layer 122 may be disposed between the gate wiring (112 and 114) and the data wiring (142, 144, and 146). In an exemplary embodiment, the gate insulating layer 122 may be disposed on the gate wiring (112 and 114), and the data wiring (142, 144, and 146) may be disposed on the gate insulating layer 122. The gate insulating layer 122 may include or be formed of, for example, silicon nitride (SiNx), silicon oxide ($SiO_2$), silicon oxynitride (SiON), or a deposition layer thereof. The gate insulating layer 122 may maintain the gate wiring (112 and 114) to be insulated from conductive layers such as the data lines 142 disposed above the gate wiring (112 and 114).

The semiconductor layer 132 may be disposed on the gate insulating layer 122, and may include or be formed of, for example, hydrogenated amorphous silicon or polycrystalline silicon. The semiconductor layer 132 may be disposed to at least partially overlap the gate electrode 114 when viewed in the top plan view. The semiconductor layer 132 may collectively define a TFT together with the gate electrode 114, the source electrode 144 and the drain electrode 146, and a channel may be formed in the semiconductor layer 132.

Figure 4:
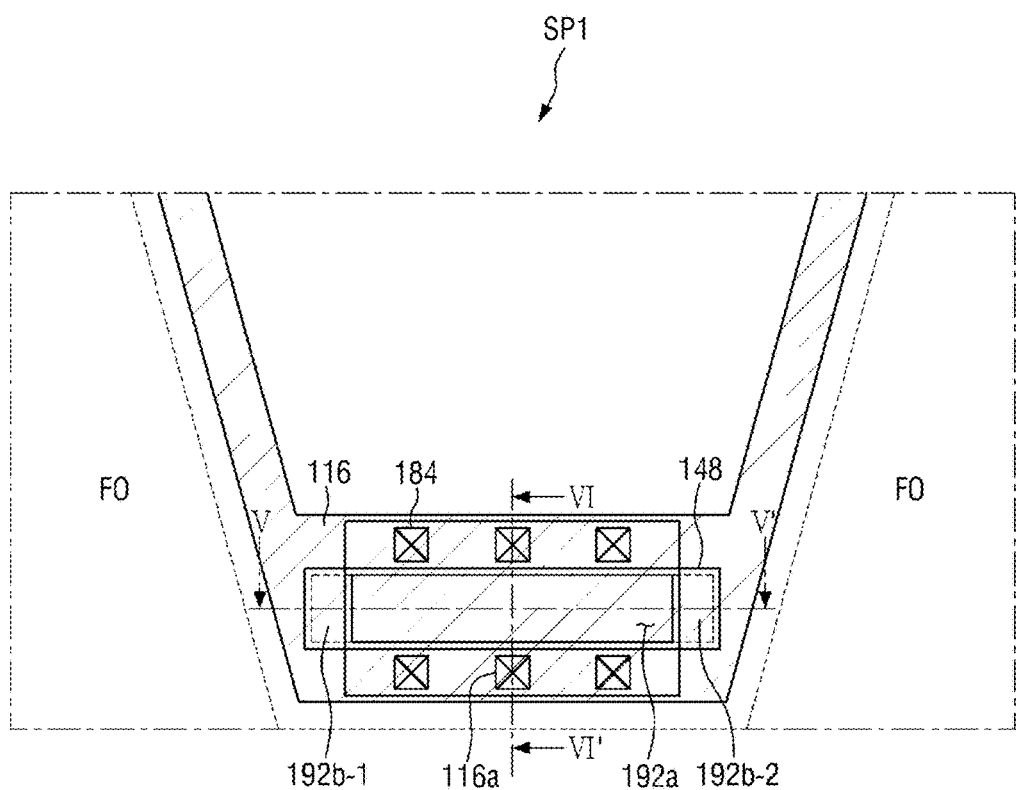
FIG. 4 is a schematic plan view of a first short portion of the LCD device of FIG. 1.

The semiconductor layer 132 may have at least one of various shapes such as an island or linear shape. In one exemplary embodiment, for example, the semiconductor layer 132 has an island shape as illustrated in FIG. 4, but the invention is not limited thereto. In such an embodiment, where the semiconductor layer 132 is in an island shape, the semiconductor layer 132 may overlap the data wiring (142, 144, and 146) when viewed in the top plan view.

An ohmic contact layer 134, which includes or is formed of n+ hydrogenated amorphous silicon doped with a high concentration of n-type impurities, may be disposed on the semiconductor layer 132. The ohmic contact layer 134 is disposed between the source electrode 144 and the drain electrode 146 and thus reduces the contact resistance between the source electrode 144 and the drain electrode 146. The ohmic contact layer 134, like the semiconductor layer 132, may have at least one of various shapes such as an island or linear shape. In an exemplary embodiment, where the semiconductor layer 132 is in an island shape, the ohmic contact layer 134 may also be in an island shape. In an alternative exemplary embodiment, where the semiconductor layer 132 is in a linear shape, the ohmic contact layer 134 may also be in a linear shape. The ohmic contact layer 134, unlike the semiconductor layer 132, is disconnected in an area where the source electrode 144 and the drain electrode 146 are opposite to, and isolated from, each other, and thus exposes the semiconductor layer 132 therethrough. The semiconductor layer 132 may form a channel in the area where the source electrode 144 and the drain electrode 146 are opposite to, and isolated from, each other.

When a channel is formed in the semiconductor layer 132 in response to a gate-on signal being applied to the gate electrode 114, the TFT may be turned on, and the drain electrode 146 may receive a data signal from the source electrode 144 and may transmit the data signal to the pixel electrode 182.

The passivation layer 152 is disposed on the data wiring (142, 144, and 146) and an exposed part of the semiconductor layer 132. The contact hole 146a may be defined or formed in the passivation layer 152 and the organic layer 172 to at least partially expose the drain electrode 146. Part of the drain electrode 146 exposed through the contact hole 146a may contact the pixel electrode 182. Accordingly, the drain electrode 146 and the pixel electrode 182 may be electrically connected to each other.

The passivation layer 152 may include an inorganic material, such as silicon nitride or silicon oxide, or a material formed by plasma enhanced chemical vapor deposition ("PECVD"), such as a-Si:C:O or a-Si:O:F.

The organic layer 172 may be disposed on the passivation layer 152. The organic layer 172 may include a material having high planarization characteristics and photosensitivity. The organic layer 172 may include the contact hole 146a, which at least partially exposes the drain electrode 136 therethrough.

A color filter 162 may be disposed between the organic layer 172 and the passivation layer 152. In one exemplary embodiment, for example, the color filter 162 includes a red ("R") filter, a green ("G") filter, and a blue ("B") filter. Each of the R, G, and B filters may be provided in each of the pixels, thereby forming an R, G, or B pixel. The color filter 162 may be disposed to overlap the pixel electrode 182 when viewed in the top plan view. The color filter 162 may include a photosensitive organic material including a pigment. The organic layer 172 may be disposed on the color filter 162 to planarize a height difference between the R, G and B filters. The color filter 162 may be covered by the organic layer 172. In an exemplary embodiment, the color filter 162 may be covered by the organic layer 172 not to be exposed, but the invention is not limited thereto.

The pixel electrode 182 may be disposed on the organic layer 172 for each unit pixel. Part of the pixel electrode 182 may be disposed or located in the contact hole 146a. The part of the pixel electrode 182 in the contact hole 146a may be placed in contact with, and electrically connected to, the drain electrode 146.

In response to a data voltage being applied to the pixel electrode 182 via the contact hole 146a, the pixel electrode 182 may generate an electric field together with the common electrode 212 to rotate the liquid crystal molecules included in the liquid crystal layer 300. The pixel electrode 182 may include a transparent conductive material such as indium tin oxide ("ITO") or indium zinc oxide ("IZO"), but the invention is not limited thereto.

A light-shielding pattern 192 may be disposed on the organic layer 172 and the pixel electrode 182. The light-shielding pattern 192 effectively prevents light leakage. The light-shielding pattern 192 may be provided in TFT regions and non-pixel regions (such as areas between the pixels and areas where the gate lines 112 and the data lines 142 are provided).

The light-shielding pattern 192 may include a black organic polymer material including a black dye or pigment, or may include a metal or metal oxide such as chromium (Cr) or chromium oxide.

A column spacer 194 may effectively maintain the gap between the first and second substrates 102 and a second substrate 202. In some exemplary embodiments, as illustrated in FIG. 4, the end of the column spacer 194 may be in contact with the second display substrate 200, but the invention is not limited thereto. Alternatively, the end of the column spacer 194 may be a predetermined distance from the second display substrate 200.

Although not specifically illustrated, a plurality of column spacers 194 having different heights may be provided. In one exemplary embodiment, for example, the plurality of column spacers 194 may include main column spacers, which are relatively tall, and sub-column spacers, which are relatively short. In such an embodiment, the gap between the first and second display substrates 100 and 200 may be maintained, against external pressure, primarily by the main column spacers. However, in response to the external pressure being further applied, the gap between the first and second display substrates 100 and 200 may be maintained secondarily by the sub-column spacers.

The column spacer 194 may be disposed in an area corresponding to the TFT. The column spacer 194 may at least partially overlap the gate wiring (112 and 114) when viewed in the top plan view, but the invention is not limited thereto. In exemplary embodiments, the arrangement of the column spacer 194 is not particularly limited.

In some exemplary embodiments, the column spacer 194 may include or be formed of the same material as the light-shielding pattern 192. The column spacer 194 and the light-shielding pattern 192 may be formed at the same time by a single patterning process using a halftone mask or slit mask exposure. That is, the column spacer 194 and the light-shielding pattern 192 may be formed at the same time using the same material.

The second display substrate 200 has the second substrate 202 as a base substrate. The second substrate 202 may be an insulating substrate. More specifically, the second substrate 202, like the first substrate 102, may include an insulating material such as transparent glass, quartz, ceramic, silicon or transparent plastic. The material of the second substrate 202 may be appropriately selected. In some exemplary embodiments, the second substrate 202 may be flexible. That is, the second substrate 202 may be deformable through rolling, folding, or bending. The second substrate 202 may be disposed to face the first substrate 102.

The common electrode 212 may be disposed on the second substrate 202. The common electrode 212 may receive the common voltage and may thus form an electric field together with the pixel electrode 182 so as to control the alignment direction of the liquid crystal molecules included in the liquid crystal layer 300. The common voltage, which is applied to a plurality of common voltage lines (116 and 184), may be provided to the common electrode 212 via the conductive balls.

The common electrode 212 may be integrally formed as a single unitary and indivisible unit and disposed across the pixel regions surrounded by the gate lines 112 and the data lines 142. The common electrode 212 may include or be formed of a transparent conductive material such as ITO or IZO, but the invention is not limited thereto.

Although not specifically illustrated, alignment layers may be respectively provided on first surfaces of the first and second substrates 102 and 202 that face the liquid crystal layer 300. That is, the alignment layers may be disposed on the pixel electrode 182, the common electrode 212, the light-shielding pattern 192 and the column spacer 194. The alignment layers may include a resin polymer such as polyimide, polyamic acid, polyamide, polyamide-imide, polyester, polyethylene, polyurethane, or polystyrene or a mixture thereof. Alternatively, the alignment layers may include a monomer of the resin polymer.

In some exemplary embodiments, although not specifically illustrated, a dam may be disposed on the first surfaces of the first and second substrates 102 and 202 to prevent the flow of the alignment layers. The dam may be located on a further inner side of the first and second substrates 102 and 202 than a short point to which the common voltage is applied is.

The structures of the first short portion SP1, the middle portion MP, and the second short portion SP2 in an exemplary embodiment will hereinafter be described in greater detail.

First, the first and second short portions SP1 and SP2 will hereinafter be described.

Figure 5:
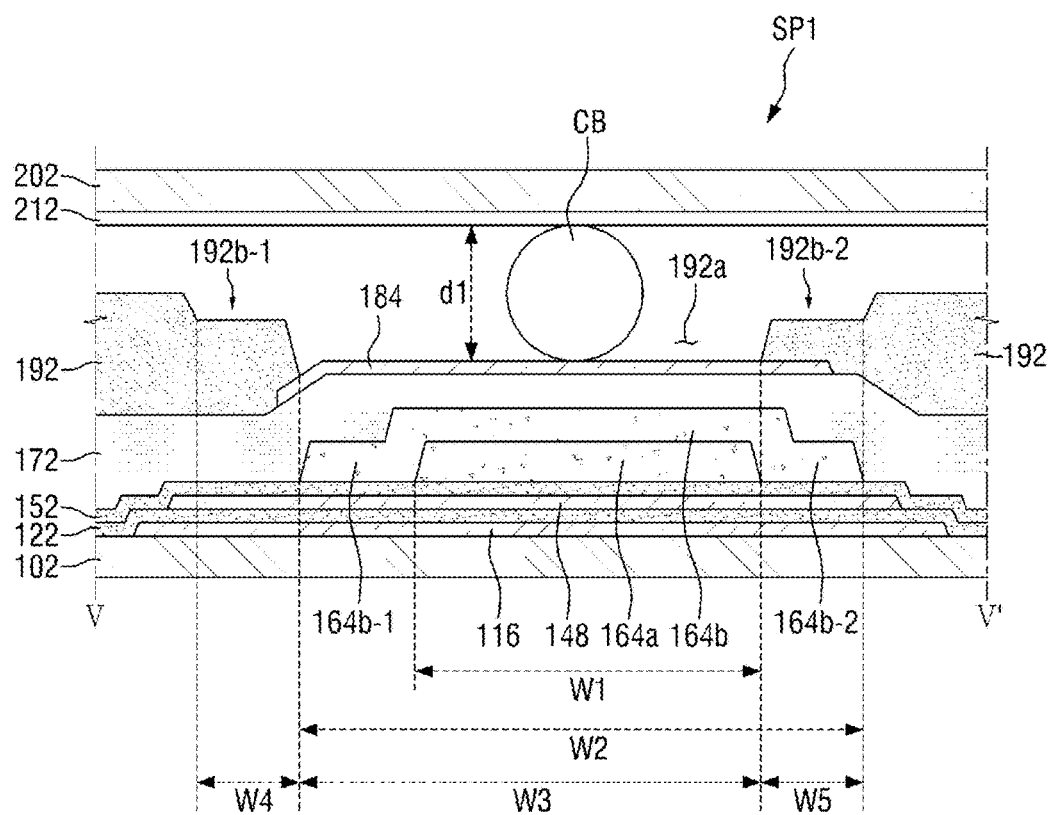
FIG. 5 is a cross-sectional view taken along line V-V' of FIG. 4.
Figure 6:
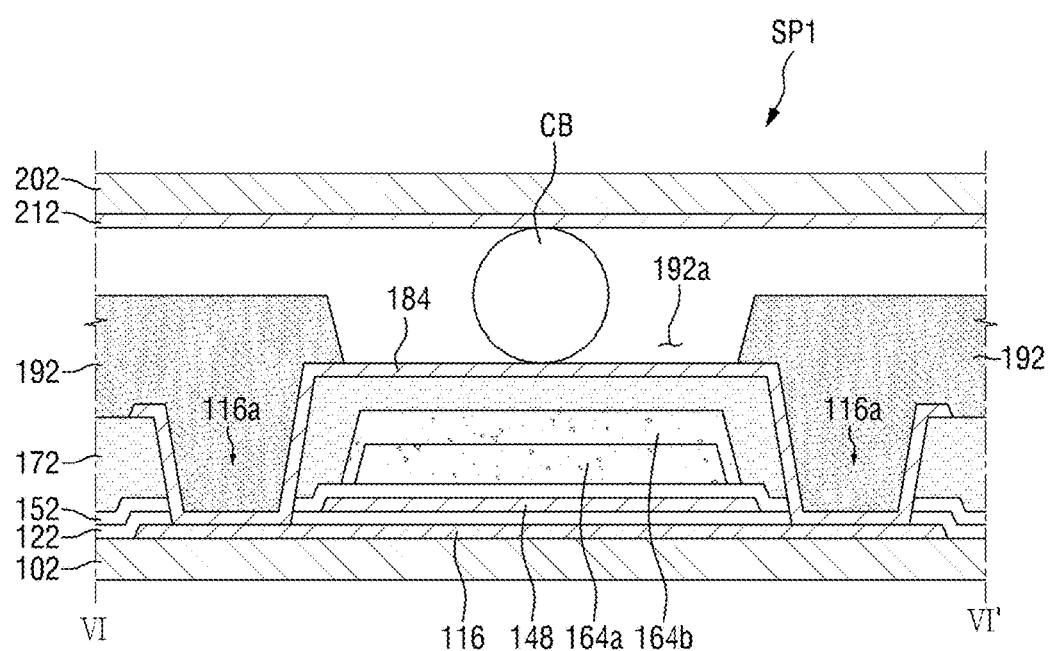
FIG. 6 is a cross-sectional view taken along line VI-VI' of FIG. 4.

FIG. 4 is a schematic plan view of a first short portion of the LCD device of FIG. 1. FIG. 5 is a cross-sectional view taken along line V-V' of FIG. 4. FIG. 6 is a cross-sectional view taken along line VI-VI' of FIG. 4.

Figure 7:
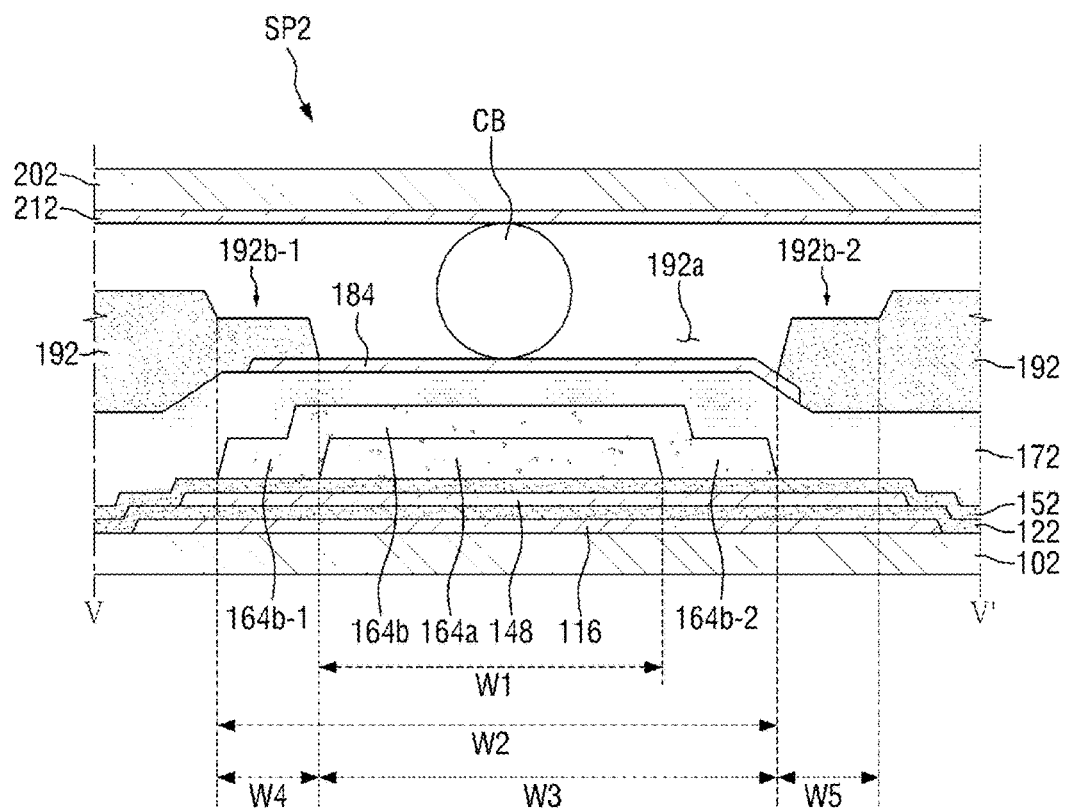
FIG. 7 is a cross-sectional view of a second short portion of the LCD device of FIG. 1.

The plan view of FIG. 4 and the cross-sectional view of FIG. 6 may also be applicable to a description of the second short portion SP2. FIG. 7 is a cross-sectional view of a second short portion of the LCD device of FIG. 1. More specifically, FIG. 7 is a cross-sectional view corresponding to the cross-sectional view taken along line V-V' of FIG. 4.

Referring to FIGS. 4 to 7, the first and second short portions SP1 and SP2 may be areas that are electrically connected to the common voltage lines (116 and 184) and the common electrode 212 via a conductive ball CB and apply the common voltage to the common electrode 212. In some exemplary embodiments, the first and second short portions SP1 and SP2 may be sequentially arranged in the first direction (for example, the vertical direction), and the middle portion MP may be disposed between the first and second short portions SP1 and SP2.

The common voltage lines (116 and 184) may be disposed in the non-display area NDA of the first substrate 102. The common voltage lines (116 and 184) may be disposed along the edges of the first substrate 102.

Referring to FIGS. 4 and 6, the common voltage lines (116 and 184) may include a first common voltage line 116 and a second common voltage line 184. The second common voltage line 184 may be disposed on the first common voltage line 116. The first and second common voltage lines 116 and 184 may be electrically connected to each other via openings 116a, which are defined or formed in the gate insulating layer 112, the passivation layer 152 and the organic layer 172.

In an exemplary embodiment, the first common voltage line 116 may contact parts of the second common voltage line 184 in the openings 116a, and part of the second common voltage line 184 exposed through an open portion 192a of the light-shielding pattern 192 may contact the conductive ball CB. As described above, in some exemplary embodiments, the conductive ball CB may be a conductive member included in the sealing member. The conductive ball CB may contact the common electrode 212 on the second substrate 202. Accordingly, the common voltage applied to the first common voltage line 116 may be applied to the common electrode 212 via the second common voltage line 184 and the conductive ball CB.

In some exemplary embodiments, the first common voltage line 116 may be disposed in a same level with the gate wiring (112 and 114), and the second common voltage line 184 may be disposed in a same level with the pixel electrode 182. However, a structure for applying the common voltage to the common electrode 182 is not limited to these exemplary embodiments.

The first common voltage line 116 may be expanded in, or near, areas of contact with the second common voltage line 184. The first common voltage line 116 may be expanded between the fan-out portions FO where the data transmission lines 142a extending from the data driver 400 are provided.

In such an embodiment, where the first common voltage line 116 is expanded in predetermined areas, the first common voltage line 116 may contact the second common voltage line 184 through the openings 116a. In one exemplary embodiment, for example, as illustrated in FIG. 4, the openings 116a may be disposed on two opposite sides of the open portion 192a of the light-shielding pattern 192. The common voltage may be applied to the second common voltage line 184 via the openings 116a, which is more effective than applying the common voltage to the second common voltage line 184 via a single open portion. The openings 116a shown in FIG. 4 are merely exemplary, and the invention is not limited thereto.

FIGS. 5 and 6 illustrate an exemplary embodiment where the conductive ball CB as being disposed on part of the second common voltage line 184 exposed through the open portion 192a of the light-shielding pattern 192, but the invention is not limited thereto. In such an embodiment, the conductive ball CB may be located and distributed at various locations in the sealing member, and may even be disposed on the light-shielding pattern 192. The common voltage may be applied to the common electrode 212 via various means other than the conductive ball CB.

The LCD device 10 may apply the common voltage to the common electrode 212 on the second substrate 202 via the conductive ball CB. Accordingly, a point at which the common voltage is applied to the common electrode 212, i.e., a short point, may be formed substantially inside the open portion 192a of the light-shielding pattern 192.

In an exemplary embodiment, the light-shielding pattern 192 may include the open portion 192a for applying the common voltage to the common electrode 212 on the second substrate 202. The open portion 192a may not overlap the fan-out portions FO when viewed in the top plan view. The open portion 192a may extend in a predetermined direction, for example, a horizontal direction, as illustrated in FIG. 4. The second common voltage line 184 may be at least partially exposed by the open portion 192a, and the exposed part of the second common voltage line 194 may contact the conductive ball CB. Accordingly, the short point may be defined substantially inside the open portion 192a.

The open portion 192a of the light-shielding pattern 192 may be disposed in the non-display area NDA. The open portion 192a may be on an inner side of the light-shielding pattern 192. In an exemplary embodiment, the open portion 192a may be formed on an inner side of the light-shielding pattern 192 in the non-display area NDA.

The open portion 192a of the light-shielding pattern 192 may be between the fan-out portions FO where the data transmission lines 142a extending from the data driver 400 are provided. Similarly, the second common voltage line 184 may be disposed between the fan-out portions FO. In such an embodiment, the open portion 192a and the second common voltage line 184 may be isolated from each other between the fan-out portions FO in a top plan view. The open portion 192a and the second common voltage line 184 may be rectangular in a top plan view, as illustrated in FIG. 4, but the invention is not limited thereto.

In some exemplary embodiments, the open portion 192a may be formed on an inner side of the second common voltage line 184. In an exemplary embodiment, the open portion 192a may at least partially overlap the second common voltage line 184 when viewed in the top plan view.

A dummy color layer (164a and 164b) may be disposed at a location corresponding to the open portion 192a of the light-shielding pattern 192. The dummy color layer (164a and 164b) may be disposed below the open portion 192a. The dummy color layer (164a and 164b) may at least partially overlap the open portion 192a when viewed in the top plan view. The open portion 192a may extend in a predetermined direction, for example, the horizontal direction, as illustrated in FIG. 4, and the dummy color layer (164a and 164b) may also extend in the predetermined direction.

The dummy color layer (164a and 164b) may be disposed below the light-shielding pattern 192. The dummy color layer (164a and 164b) may secure a sufficient height for the conductive ball CB and the common electrode 212 to be in contact with each other and may effectively prevent light leakage that may occur in the open portion 192a.

In some exemplary embodiments, the dummy color layer (164a and 164b) may be disposed on a level with the color filter 162. In an exemplary embodiment, the dummy color layer (164a and 164b) may be disposed on the passivation layer 152. The dummy color layer (164a and 164b) may include a photosensitive organic material including a pigment. However, the arrangement and material of the dummy color layer (164a and 164b) are not limited to those set forth herein.

In an exemplary embodiment where the LCD device includes a large-size panel, a light-shielding pattern and a dummy color layer may be provided or formed by a stitch-shot method. In such an embodiment, the open portion of the light-shielding pattern and the dummy color layer may be misaligned with each other because a "stitch shot" for forming the light-shielding pattern differs from a "stitch shot" for forming the dummy color layer. Thus, a metal may be exposed from the bottom of the open portion such that reflected light from the metal may be visible, or a stack of the dummy color layer and the light-shielding pattern may form a protrusion such that a smudge may be visible.

To prevent such reflected light and smudge from being visible, an exemplary embodiment of the LCD device 10 may include a plurality of stepped portions (192b-1 and 192b-2), which are defined in the light-shielding pattern 192.

The stepped portions (192b-1 and 192b-2) include first and second stepped portions 192b-1 and 192b-2. The first stepped portion 192b-1 may be disposed on a side of the open portion 192a, and the second stepped portion 192b-2 may be disposed on another side (e.g., an opposing side) of the open portion 192a. In one exemplary embodiment, for example, as illustrated in FIGS. 4 and 5, the first stepped portion 192b-1 may be disposed on the left side of the open portion 192a, and the second step portion 192b-2 may be disposed on the right side of the open portion 192a.

Referring to FIGS. 5 and 7, the first and second stepped portions 192*b*-1 and 192*b*-2 may be recessed downwardly from the top surface of the light-shielding pattern 192, and may protrude upwardly relative to the open portion 192*a*.

In some exemplary embodiments, a width W4, in the first direction, of the first stepped portion 192*b*-1 may be substantially the same as a width W5, in the first direction, of the second stepped portion 192*b*-2, as illustrated in FIGS. 5 and 7, but the invention is not limited thereto.

The dummy color layer (164*a* and 164*b*) may overlap at least one of the first and second stepped portions 192*b*-1 and 192*b*-2 when viewed in the top plan view. Referring to FIG. 5, the dummy color layer (164*a* and 164*b*) of the first short portion SP1 may overlap the second stepped portion 192*b*-2, but may not overlap the first stepped portion 192*b*-1 when viewed in the top plan view. Referring to FIG. 7, the dummy color layer (164*a* and 164*b*) of the second short portion SP2 may overlap the first stepped portion 192*b*-1, but may not overlap the second stepped portion 192*b*-2 when viewed in the top plan view.

In some exemplary embodiments, the dummy color layer (164*a* and 164*b*) may include first- and second-color dummy color layers 164*a* and 164*b*, which are sequentially stacked. In such an embodiment, the first-color dummy color layer 164 have a first color, and the second-color dummy color layer 164*b* has a second color. In such an embodiment, one of the first and second colors is a blue color, and the other color the first and second colors is a red color. In such an embodiment, the second-color dummy color layer 164*b* may be disposed on the first-color dummy color layer 164*a*. Referring to FIGS. 5 and 7, a width W2, in the first direction, of the second-color dummy color layer 164*b* may be larger than a width W1, in the first direction, of the first-color dummy color layer 164*a*. The second-color dummy color layer 164*b* may be disposed to cover the entire surface of the first-color dummy color layer 164*a*. In such an embodiment, the first-color dummy color layer 164*a* may be disposed on an inner side of the second-color dummy color layer 164*b*.

In such an embodiment, since the second-color dummy color layer 164*b* may cover the entire surface of the first-color dummy color layer 164*a*, the second-color dummy color layer 164*b* may include a first edge portion 164*b*-1, which is disposed on a side of the second-color dummy color layer 164*b* in the first direction and does not overlap the first-color dummy color layer 164*a*, and a second edge portion 164*b*-2, which is disposed on the another side of the second-color dummy color layer 164*b* in the first direction and does not overlap the first-color dummy color layer 164*a*, when viewed in the top plan view.

In such an embodiment, the second stepped portion 192*b*-2 of the first short portion SP1 may overlap the second edge portion 164*b*-2, as illustrated in FIG. 5, and the first stepped portion 192*b*-1 of the second short portion SP2 may overlap the first edge portion 164*b*-1, as illustrated in FIG. 7.

In such an embodiment, even if the open portion 192*a* and the dummy color layer (164*a* and 164*b*) for forming a height difference are misaligned due to different stitch shots being used to form the light-shielding pattern 192 and the dummy color layer (164*a* and 164*b*), any reflected light from a metal below the open portion 192*a* may be effectively prevented from being visible by the first and second edge portions 164*b*-1 and 164*b*-2 of the dummy color layer (164*a* and 164*b*).

In such an embodiment, even if the open portion 192*a* and the dummy color layer (164*a* and 164*b*) for forming a height difference are misaligned due to different stitch shots being used to form the light-shielding pattern 192 and the dummy color layer (164*a* and 164*b*), the difference in height between the light-shielding pattern 192 and the dummy color layer (164*a* and 164*b*) may be adjusted using the first and second stepped portions 192*b*-1 and 192*b*2. Accordingly, any smudge that may be generated due to a stack of the dummy color layer (164*a* and 164*b*) and the light-shielding pattern 192 forming a protrusion may be improved.

In some exemplary embodiments, the first-color dummy color layer 164*a* may be disposed on an inner side of the open portion 192*a*. Accordingly, the first-color dummy color layer 164*a* may not overlap the first and second stepped portions 192*b*-1 and 192*b*-2 when viewed in the top plan view. However, the invention is not limited to these exemplary embodiments.

In some exemplary embodiments, the width W2 of the second-color dummy color layer 164*b* may be larger than a width W3 of the open portion 192*a*. Accordingly, the open portion 192*a* may be disposed on the inner side of the second-color dummy color layer 164*b*. However, the invention is not limited to these exemplary embodiments.

In some exemplary embodiments, the first-color dummy color layer 164*a* may have a different thickness from the second-color dummy color layer 164*b*. In one exemplary embodiment, for example, as illustrated in FIGS. 5 to 7, an upper dummy color layer may have a smaller thickness than a lower dummy color layer. In such an embodiment, the thickness of the first-color dummy color layer 164*a* may be larger than the thickness of the second-color dummy color layer 164*b*. The thickness of the first-color dummy color layer 164*a* may be substantially the same as the thickness of the color filter 162. However, the invention is not limited to these exemplary embodiments.

In some exemplary embodiments, the first-color dummy color layer 164*a* may have a first color, and the second-color dummy color layer 164*b* may have a second color, which is different from the first color. At least one of the first and second colors may be B. In one exemplary embodiment, for example, the first color may be R, and the second color may be B. Alternatively, the first color may be B, and the second color may be R. However, the invention is not limited to these exemplary embodiments.

The LCD device 10 may include a dummy metal layer 148, which is disposed below the open portion 192*a* to overlap the open portion 192*a* when viewed in the top plan view. The dummy metal layer 148 may be disposed below the dummy color layer (164*a* and 164*b*). The dummy metal layer 148, like the dummy color layer (164*a* and 164*b*), may secure a sufficient height for the conductive ball CB and the common electrode 212 to be in contact with each other and may effectively prevent light leakage that may occur in the open portion 192*a*.

In some exemplary embodiments, the dummy metal layer 148 may be disposed in a same level with the data lines 142 or directly on a same layer as the data lines 142, but the invention is not limited thereto.

In some exemplary embodiments, the dummy metal layer 148 may be rectangular in a top plan view, as illustrated in FIG. 4, but the invention is not limited thereto.

Referring to FIG. 4, in some exemplary embodiments, the open portion 192*a* and the first and second stepped portions 192*b*-1 and 192*b*-2 may be disposed on an inner side of the dummy metal layer 148, but the arrangement of the dummy metal layer 148 is not limited to these exemplary embodiments.

The structure of the middle portion MP will hereinafter be described.

The plan view of FIG. 4 may also be applicable to a description of the middle portion MP.

Figure 8:
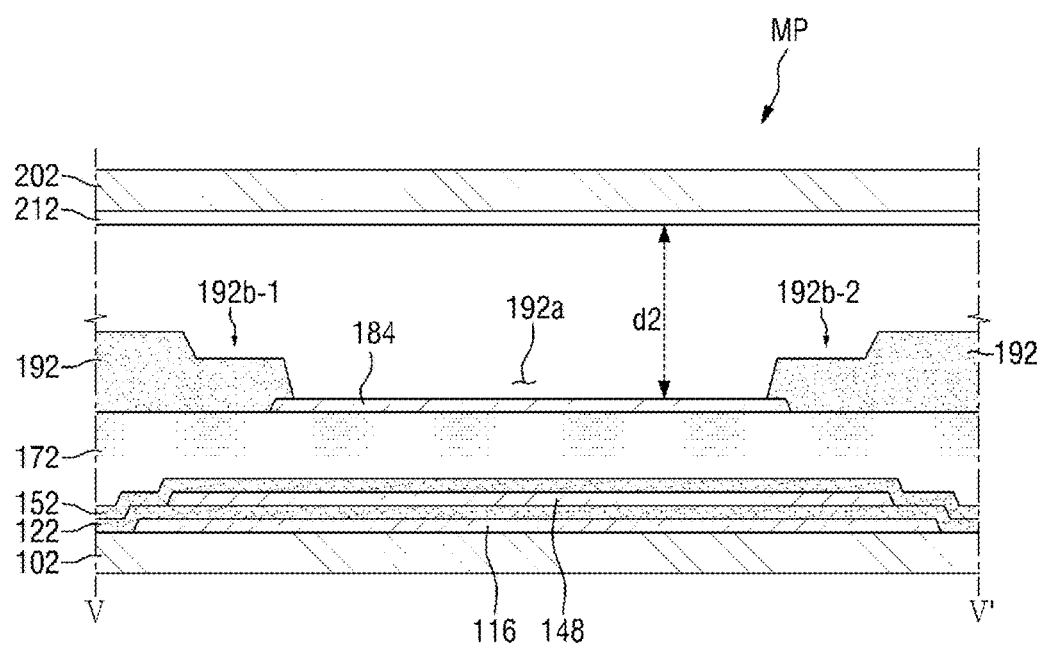
FIGS. 8 and 9 are cross-sectional views of a middle portion of the LCD device of FIG. 1.
Figure 9:
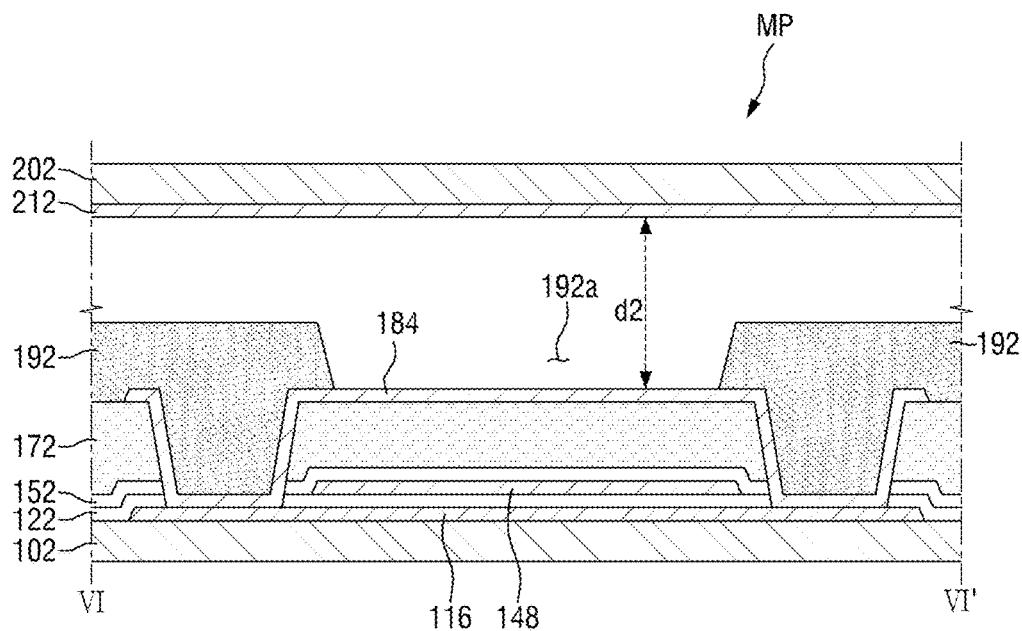
Figure 10:
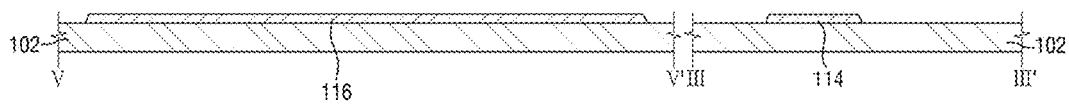
FIGS. 10 through 21 are cross-sectional views illustrating a method of manufacturing an LCD device according to an exemplary embodiment of the invention.

FIGS. 8 and 9 are cross-sectional views of a middle portion of the LCD device of FIG. 1. More specifically, FIG. 8 is a cross-sectional view taken along line V-V' of FIG. 4, and FIG. 9 is a cross-sectional view taken along line VI-VI' of FIG. 4.

Referring to FIGS. 8 and 9, the middle portion MP of the LCD device 10 has substantially the same structure as the first and second short portions SP1 and SP2 except that no dummy color layer (164a and 164b) is provided therein.

Since no dummy color layer (164a and 164b) is provided in the middle portion MP, a distance d2 between the common electrode 212 and the second common voltage line 184 in the middle portion MP may be larger than a distance d1 between the common electrode 212 and the second common voltage line 184 in the first and second short portions SP1 and SP2.

The first short portion SP1 may be disposed on a side of the middle portion MP, and the second short portion SP2 may be disposed on another side of the middle portion MP. In an exemplary embodiment, more than one first short portion SP1 may be consecutively arranged on a side of the middle portion MP, and more than one second short portion SP2 may be consecutively arranged on another side of the middle portion MP.

In the exemplary embodiment of FIGS. 1, 8 and 9, the middle portion MP may be provided in the LCD device 10, but the invention is not limited thereto. Alternatively, an LCD device having no middle portion MP may be provided.

An exemplary embodiment of a method of manufacturing the LCD device 10 will hereinafter be described.

FIGS. 10 through 21 are cross-sectional views illustrating a method of manufacturing an LCD device according to an exemplary embodiment of the invention.

Referring to FIGS. 2, 3, 5 and 10, gate wiring (112 and 114) is provided or formed on a first substrate 102.

A first metal layer (not illustrated) is provided or formed on the first substrate 102 including a transparent material such as, for example, glass and quartz. The first metal layer may include or be formed of Al, Cu, Ag, Mo, Cr, Ti, Ta, or an alloy thereof, and may consist of two or more layers having different physical properties. In one exemplary embodiment, for example, the first metal layer may be formed through deposition by sputtering. Thereafter, the first metal layer may be patterned through photolithography using an exposure mask, thereby forming the gate wiring (112 and 114) including a gate line 112 and a gate electrode 114. The gate electrode 114 may be defined by a protrusion branched off from the gate line 112.

In some exemplary embodiments, a first common voltage line 116 may be provided or formed simultaneously with the gate wiring (112 and 114) or by a same process used to form the gate wiring (112 and 114). In such exemplary embodiments, the first common voltage line 116 may include or be formed of the same material as the gate wiring (112 and 114) to be in a same level with the gate wiring (112 and 114) or directly on a same layer, e.g., directly on the first substrate 102. However, the invention is not limited to these exemplary embodiments. Alternatively, the first common voltage line 116 and the gate wiring (112 and 114) may not be formed at the same time, and may not be disposed in a same level with each other.

In some exemplary embodiments, a data transmission line 142a may be formed by the same process used to form the gate wiring (112 and 114). In such embodiments, the data transmission line 142a may include or be formed of the same material as the gate wiring (112 and 114) to be in a same level with the gate wiring (112 and 114). However, the invention is not limited to these exemplary embodiments. Alternatively, the data transmission line 142a and the gate wiring (112 and 114) may not be formed at the same time, and may not be disposed in a same level with each other.

Figure 11:
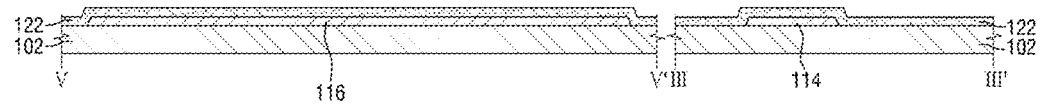

Thereafter, referring to FIG. 11, a gate insulating layer 122 is provided or formed on the gate wiring (112 and 114). The gate insulating layer 122 may be formed by PECVD and may include silicon nitride (SiNx) or silicon oxide ($SiO_2$).

Figure 12:
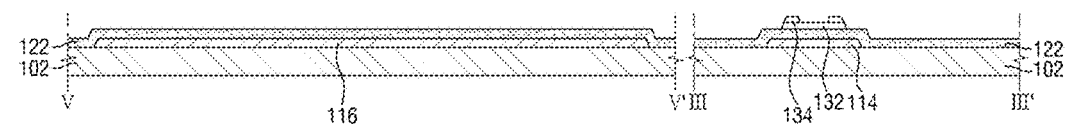

Thereafter, referring to FIG. 12, a semiconductor layer 132 and an ohmic contact layer 134 may be provided or formed on the gate insulating layer 122. The semiconductor layer 132 may include or be formed of hydrogenated amorphous silicon or polycrystalline silicon. The semiconductor layer 132 and the ohmic contact layer 134 may be formed by photolithography.

Figure 13:
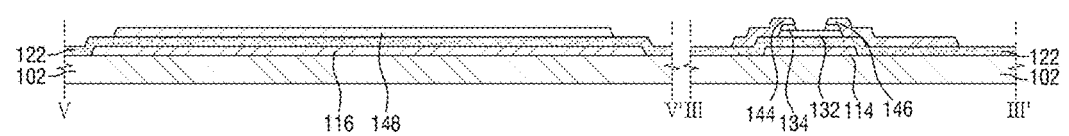

Thereafter, referring to FIG. 13, data wiring (142, 144, and 146) including a data line 142, which intersects the gate line 112 to define a unit pixel, and source and drain electrodes 144 and 146 is provided or formed on the gate insulating layer 122, the semiconductor layer 132 and the ohmic contact layer 134 through photolithography. The data wiring (142, 144, and 146), like the gate wiring (112 and 114), may include or be formed of Al, Cu, Ag, Mo, Cr, Ti, Ta, or an alloy thereof and may have a multi-layer structure including two or more layers having different physical properties from each other.

In some exemplary embodiments, a dummy metal layer 148 may be formed by the same process used to form the data wiring (142, 144, and 146). In such exemplary embodiments, the dummy metal layer 148 may include or be formed of the same material as the data wiring (142, 144, and 146) to be in a same level with the data wiring (142, 144, and 146). However, the invention is not limited to these exemplary embodiments. Alternatively, the dummy metal layer 148 and the data wiring (142, 144, and 146) may not be formed at the same time.

Figure 14:
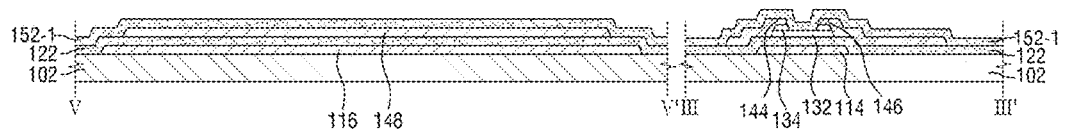

Thereafter, referring to FIG. 14, a passivation layer 152-1 is provided or formed on the first substrate 102 on which a TFT is formed to cover the dummy metal layer 148 and the data wiring (142, 144, and 146). In one exemplary embodiment, for example, the passivation layer 152-1 may include an inorganic material, such as silicon nitride or silicon oxide, or a material formed by PECVD, such as a-Si:C:O or a-Si:O:F.

Figure 15:

Thereafter, referring to FIG. 15, a color filter 162 is provided or formed on the passivation layer 152-1. The color filter 162 may be disposed in a pixel region, and may include an R filter, a G filter and a B filter, for example. The color filter 162 may include or be formed of a photosensitive organic material including a pigment. The color filter 162 may be formed by photolithography or inkjet printing, or by various other methods.

In some exemplary embodiments, a dummy color layer (164a and 164b) may be formed in a non-display area NDA by the same process used to form the color filter 162. In such embodiments, the dummy color layer (164a and 164b) may include a photosensitive organic material including a pigment.

In some exemplary embodiments, the dummy color layer (164a and 164b) may include first- and second-color dummy color layers 164a and 164b. A width W2, in a first direction, of the second-color dummy color layer 164b may be larger than a width W1, in the first direction, of the first-color dummy color layer 164*a*. The second-color dummy color layer 164*b* may be formed to cover the entire surface of the first-color dummy color layer 164*a*. In such an embodiment, the first-color dummy color layer 164*a* may be formed on the passivation layer 152-1, and then the second-color dummy color layer 164*b* may be formed on the passivation layer 152-1 and the first-color dummy color layer 164*a* to cover the entire surface of the first-color dummy color layer 164*a*.

In such an embodiment, where the second-color dummy color layer 164*b* may be formed to cover the entire surface of the first-color dummy color layer 164*a*, the second-color dummy color layer 164*b* may include a first edge portion 164*b*-1, which is disposed on a side of the second-color dummy color layer 164*b* in the first direction and does not overlap the first-color dummy color layer 164*a*, and a second edge portion 164*b*-2, which is disposed on another side of the second-color dummy color layer 164*b* in the first direction and does not overlap the first-color dummy color layer 164*a*, when viewed in the top plan view.

In some exemplary embodiments, the dummy color layer (164*a* and 164*b*) and the color filter 162 may be formed by a stitch-shot method. In one exemplary embodiment, for example, the dummy color layer (164*a* and 164*b*) and the color filter 162 may be formed by using a single mask continuously/repeatedly. However, the invention is not limited to these exemplary embodiments.

Figure 16:
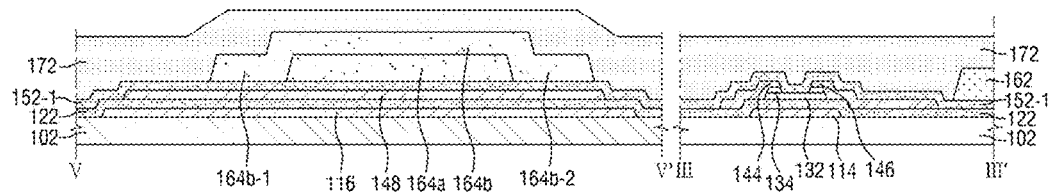

Thereafter, referring to FIG. 16, an organic layer 172 is provided or formed on the passivation layer 152-1, the color filter 162 and the dummy color layer (164*a* and 164*b*). The organic layer 172 may include or be formed of a material having high planarization characteristics and photosensitivity. The organic layer 172 may be formed by spin coating or slit coating.

Figure 17:
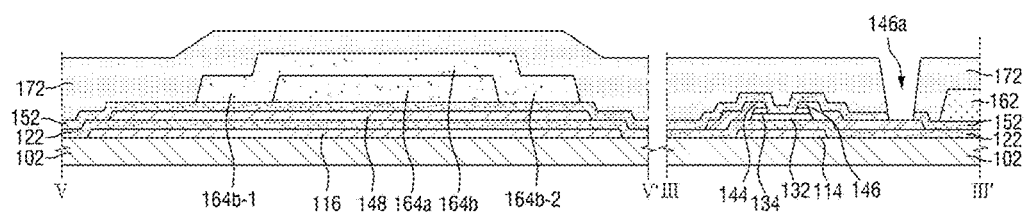

Thereafter, referring to FIG. 17, a contact hole 146*a*, which at least partially exposes the drain electrode 146, is formed in the passivation layer 152-1 and the organic layer 172. In an exemplary embodiment, the contact hole 146*a* is formed in the organic layer 172, thereby forming an organic layer 172, and the contact hole 146*a* is also formed in the passivation layer 152-1, thereby forming a passivation layer 152.

In some exemplary embodiments, openings 116*a*, which at least partially expose the first common voltage line 116, is formed in the passivation layer 152-1, the organic layer 172 and the gate insulating layer 122.

Figure 18:
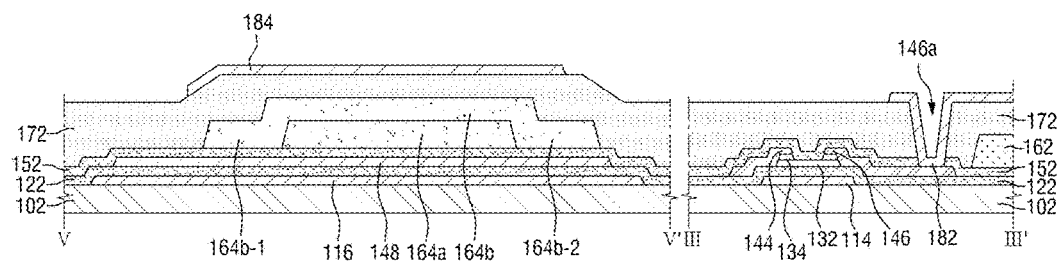

Thereafter, referring to FIG. 18, a pixel electrode 182 is provided or formed on the organic layer 172. In an exemplary embodiment, the pixel electrode 182 may be formed to contact at least part of the drain electrode 146 exposed through the contact hole 146*a*, which is formed in the organic layer 172 and the passivation layer 152. Accordingly, the pixel electrode 182 may be electrically connected to the drain electrode 146.

In some exemplary embodiments, a second common voltage line 184 may be formed by the same process used to form the pixel electrode 182. In such exemplary embodiments, the second common voltage line 184 may include or be formed of the same material as the pixel electrode 182 to be on a level with the pixel electrode 182. However, the invention is not limited to these exemplary embodiments. Alternatively, the second common voltage line 184 and the pixel electrode 182 may be formed by different processes.

Figure 19:
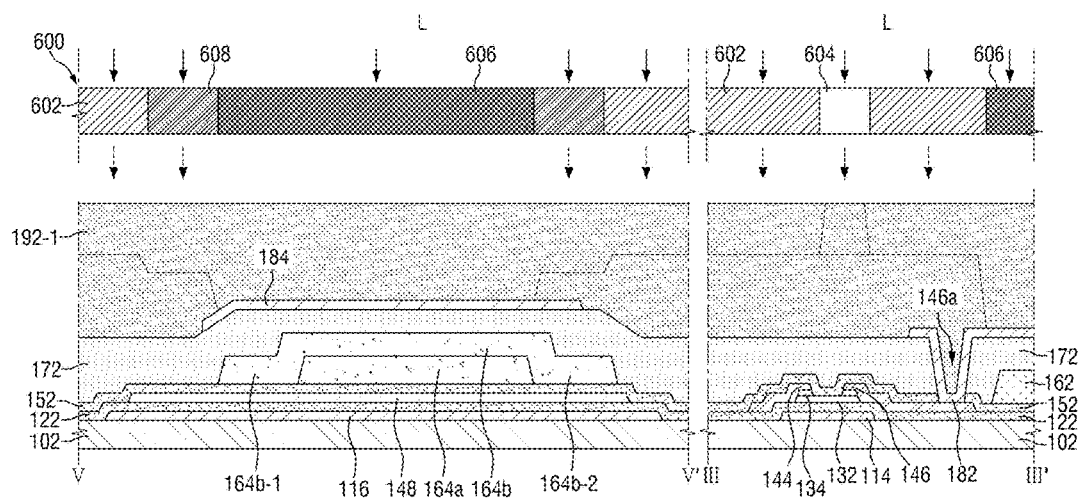
Figure 20:
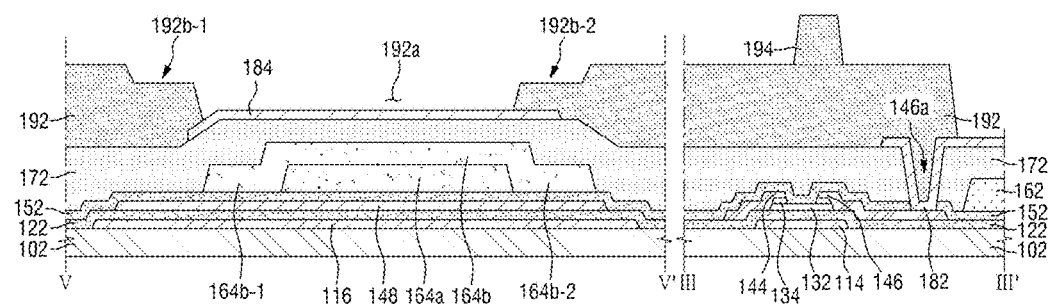

Thereafter, referring to FIGS. 19 and 20, a light-shielding layer 192-1 is provided or formed on the pixel electrode 182 and the organic layer 172. The light-shielding layer 192-1 may include a black organic polymer material including a black dye or pigment, or may include a metal or metal oxide such as Cr or chromium oxide. In an exemplary embodiment, the light-shielding layer 192-1 may be a negative photoresist layer, but the invention is not limited thereto. Alternatively, the light-shielding layer 192-1 may be a positive photoresist layer.

Thereafter, the light-shielding layer 192-1 is exposed to light using an exposure mask 600, and is then developed. The exposure mask 600 may include first halftone portions 602, second halftone portions 608, a light-transmitting portion 604 and a light-blocking portion 606. The transmittance of light L may be highest in the light-transmitting portions 604, second highest in the first halftone portions 602, third highest in the second halftone portions 608, and lowest in the light-blocking portion 606. In one exemplary embodiment, for example, as illustrated in FIG. 22, some of the light L may be transmitted through the first halftone portions 602 and the second halftone portions 608, and the degree to which the first halftone portions 602 transmit the light L therethrough may be higher than the degree to which the second halftone portions 608 transmit the light L therethrough. The light L may be substantially completely transmitted through the light-transmitting portion 604, but the invention is not limited thereto. Alternatively, the light L may be completely blocked by the light-blocking portion 606.

A portion of the light-shielding layer 192-1 corresponding to the light-transmitting portion 604 of the exposure mask 600 may be formed into a column spacer 194. Portions of the light-shielding layer 192-1 corresponding to the first halftone portions 602 of the exposure mask 600 may be formed into a light-shielding pattern 192. Portions of the light-shielding layer 192-1 corresponding to the second halftone portions 608 of the exposure mask 600 may be formed into stepped portions (192*b*-1 and 192*b*-2). A portion of the light-shielding layer 192-1 corresponding to the light-blocking portion 606 of the exposure mask 600 may be removed, thereby forming an open portion 192*a* of the light-shielding pattern 192.

The stepped portions (192*b*-1 and 192*b*-2) include first and second stepped portions 192*b*-1 and 192*b*-2. The first stepped portion 192*b*-1 may be disposed on a side of the open portion 192*a*, and the second stepped portion 192*b*-2 may be disposed on another side of the open portion 192*a*.

In some exemplary embodiments, the light-shielding pattern 192 may be formed by a stitch-shot method. In such exemplary embodiments, a stitch shot for forming the light-shielding pattern 192 along and near the left and right edges of a display panel may differ from a stitch shot for forming the light-shielding pattern 192 in a middle portion of the display panel. The stitch shot for forming the light-shielding pattern 192 in the middle portion of the display panel may be continuously/repeatedly used. However, the invention is not limited to these exemplary embodiments.

In an exemplary embodiment where the LCD device includes a large-size panel, a light-shielding pattern and a dummy color layer may be formed by a stitch-shot method. In such an embodiment, the open portion of the light-shielding pattern and the dummy color layer may be misaligned with each other because a "stitch shot" for forming the light-shielding pattern differs from a "stitch shot" for forming the dummy color layer. Thus, a metal may be exposed from the bottom of the open portion, in which case, reflected light from the metal may be visible, or a stack of the dummy color layer and the light-shielding pattern may form a protrusion, in which case, a smudge may be visible.

In an exemplary embodiment, when viewed in the top plan view, a second stepped portion 192b-2 of a first short portion SP1 may be formed to overlap the second edge portion 164b-2, and a first stepped portion 192b-1 of a second short portion SP2 may be formed to overlap the first edge portion 164b-1, such that such reflected light and smudge may be effectively prevented from being visible.

In such an embodiment, even if the open portion 192a and the dummy color layer (164a and 164b) are misaligned due to different stitch shots being used to form the light-shielding pattern 192 and the dummy color layer (164a and 164b), any reflected light from a metal below the open portion 192a may be effectively prevented from becoming visible due to the presence of the first and second edge portions 164b-1 and 164b-2 of the dummy color layer (164a and 164b).

In such an embodiment, even if the open portion 192a and the dummy color layer (164a and 164b) for forming a height difference are misaligned due to different stitch shots being used to form the light-shielding pattern 192 and the dummy color layer (164a and 164b), the difference in height between the light-shielding pattern 192 and the dummy color layer (164a and 164b) may be adjusted using the first and second stepped portions 192b-1 and 192b-2. Accordingly, any smudge that may be generated due to a stack of the dummy color layer (164a and 164b) and the light-shielding pattern 192 forming a protrusion may be improved.

A middle portion MP may be formed between the first and second short portions SP1 and SP2. The middle portion MP has substantially the same structure as the first and second short portions SP1 and SP2 except that no dummy color layer (164a and 164b) is provided therein.

Since no dummy color layer (164a and 164b) is provided in the middle portion MP, a distance d2 between a common electrode 212 and the second common voltage line 184 in the middle portion MP may be larger than a distance d1 between the common electrode 212 and the second common voltage line 184 in the first and second short portions SP1 and SP2.

In an exemplary embodiment, the middle portion MP may be provided, but the invention is not limited thereto. Alternatively, an LCD device having no middle portion MP may be provided.

Figure 21:
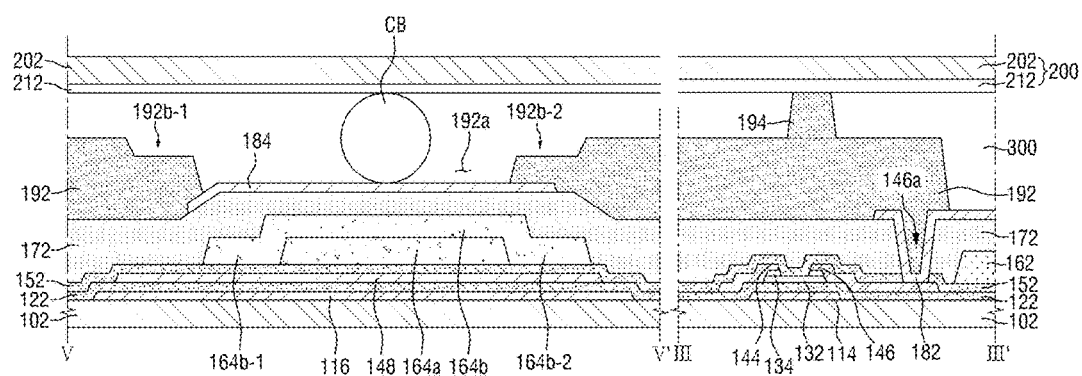

Thereafter, referring to FIG. 21, alignment layers (not illustrated) are respectively provided or formed on the first substrate 102 and a second substrate 202. Thereafter, liquid crystal molecules with positive or negative dielectric anisotropy are applied onto the first substrate 102, thereby forming a liquid crystal layer 300. Thereafter, first and second display substrates 100 and 200 with the liquid crystal layer 300 formed therebetween are coupled together by using a sealing member including, for example, a conductive ball CB.

The exemplary embodiments of the invention have been described with reference to the accompanying drawings. However, those skilled in the art will appreciate that many variations and modifications can be made to the disclosed embodiments without substantially departing from the principles of the invention. Therefore, the disclosed embodiments of the invention are used in a generic and descriptive sense only and not for purposes of limitation.

What is claimed is:

1. A liquid crystal display device, comprising: a first substrate; a second substrate disposed opposite to the first substrate, wherein a display area and a non-display area are defined in each of the first and second substrates; a liquid crystal layer disposed between the first substrate and the second substrate; a common voltage line disposed in the non-display area of the first substrate; a light-shielding pattern disposed on the common voltage line and including an open portion, which at least partially exposes the common voltage line; and a dummy color layer disposed below the common voltage line and at least partially overlapping the open portion when viewed from a top plan view, wherein the light-shielding pattern comprises: a first portion disposed on a side of the open portion; and a second portion disposed on another side of the open portion, wherein each of the first portion and the second portion includes a first upper surface, a first slope, a second upper surface, and a second slope, wherein the second upper surface is below the first upper surface, wherein the first slope is between the first upper surface and the second upper surface, wherein the second upper surface is between the first slope and the second slope, wherein the second slope defines the open portion, and wherein the dummy color layer overlaps at least one of the second upper surfaces of the first and the second portions when viewed from the top plan view.

2. The liquid crystal display device of claim 1, further comprising:
a conductive member disposed on the open portion; and
a common electrode disposed on the second substrate,
wherein the common voltage line and the common electrode are electrically connected to each other by the conductive member.

3. The liquid crystal display device of claim 1, wherein the dummy color layer comprises:
a first color dummy color layer having a first color; and
a second color dummy color layer having a second color and disposed on the first color dummy color layer.

4. The liquid crystal display device of claim 3, wherein
a width, in a first direction, of the second color dummy color layer is larger than a width, in the first direction, of the first color dummy color layer, and
the second color dummy color layer comprises:
a first edge portion, which is disposed on a side of the second color dummy color layer in the first direction and does not overlap the first color dummy color layer when viewed from the top plan view; and
a second edge portion, which is disposed on another side of the second color dummy color layer in the first direction and does not overlap the first color dummy color layer when viewed from the top plan view.

5. The liquid crystal display device of claim 4, wherein
the second upper surface of the first portion overlaps the first edge portion when viewed from the top plan view, and
the second upper surface of the second portion does not overlap the second edge portion when viewed from the top plan view.

6. The liquid crystal display device of claim 3, wherein one of the first and second colors is a blue color, and the other color the first and second colors is a red color.

7. The liquid crystal display device of claim 1, further comprising:
a dummy metal layer disposed below and overlapping the dummy color layer when viewed from the top plan view.

8. The liquid crystal display device of claim 1, wherein the first substrate comprises a fan-out portion, which is disposed in the non-display area, and the open portion does not overlap the fan-out portion when viewed from the top plan view.

* * * * *